US012580168B2

(12) United States Patent
Karino et al.

(10) Patent No.: US 12,580,168 B2
(45) Date of Patent: Mar. 17, 2026

(54) SPUTTERING APPARATUS

(71) Applicant: Canon Anelva Corporation, Kawasaki (JP)

(72) Inventors: Susumu Karino, Tokyo (JP); Tetsuro Toda, San Jose, CA (US); Tooru Fujihara, Tokyo (JP)

(73) Assignee: Canon Anelva Corporation, Kawasaki (JP)

( * ) Notice: Subject to any disclaimer, the term of this patent is extended or adjusted under 35 U.S.C. 154(b) by 0 days.

(21) Appl. No.: 18/498,212

(22) Filed: Oct. 31, 2023

(65) Prior Publication Data

US 2024/0063003 A1 Feb. 22, 2024

Related U.S. Application Data

(63) Continuation of application No. PCT/JP2021/031983, filed on Aug. 31, 2021.

(51) Int. Cl.
| | |
|---|---|
| *H01J 37/34* | (2006.01) |
| *C23C 14/22* | (2006.01) |
| *C23C 14/35* | (2006.01) |

(52) U.S. Cl.
CPC ........ *H01J 37/3417* (2013.01); *C23C 14/225* (2013.01); *C23C 14/352* (2013.01);
(Continued)

(58) Field of Classification Search
CPC ............... H01J 37/3417; H01J 37/3408; H01J 37/3435; H01J 37/3455; C23C 14/225; C23C 14/352; C23C 14/3464
See application file for complete search history.

(56) References Cited

U.S. PATENT DOCUMENTS

| | | | |
|---|---|---|---|
| 6,783,637 B2 * | 8/2004 | Slaughter | C23C 14/564 315/111.81 |
| 8,178,934 B2 * | 5/2012 | Kitano | H10D 64/037 257/632 |

(Continued)

FOREIGN PATENT DOCUMENTS

| | | |
|---|---|---|
| CN | 101187008 A | 5/2008 |
| CN | 109750263 A | 5/2019 |

(Continued)

OTHER PUBLICATIONS

International Search Report (PCT/ISA/210) and Written Opinion with translation mailed on Nov. 2, 2021, by the Japan Patent Office as the International Searching Authority for International Application No. PCT/JP2021/031983. (8 pages).

(Continued)

*Primary Examiner* — Michael A Band
(74) *Attorney, Agent, or Firm* — Buchanan Ingersoll & Rooney PC

(57) ABSTRACT

A sputtering apparatus includes a first target holder configured to hold a first target such that a first surface of the first target faces the processing space, and a second target holder configured to hold a second target such that a second surface of the second target faces the processing space, wherein the first target holder holds the first target such that an orthogonal projection vector of a first normal vector, which is a normal vector of the first surface, with respect to a virtual plane including the substrate holding surface is directed to a direction away from the substrate, and the second target holder holds the second target such that an orthogonal projection vector of a second normal vector, which is a normal vector of the second surface, with respect to the virtual plane is directed to a direction away from the substrate.

3 Claims, 9 Drawing Sheets

(52) U.S. Cl.
  CPC ...... *H01J 37/3408* (2013.01); *H01J 37/3435*
          (2013.01); *H01J 37/347* (2013.01)

(56)                References Cited

U.S. PATENT DOCUMENTS

|  |  |  |  |  |
|---|---|---|---|---|
| 8,236,152 | B2 | 8/2012 | Guo et al. | |
| 9,090,974 | B2 * | 7/2015 | Yamaguchi | ............. C23C 14/50 |
| 10,062,551 | B2 | 8/2018 | Ishihara et al. | |
| 10,508,332 | B2 | 12/2019 | Matsuzaki et al. | |
| 2008/0121514 | A1 | 5/2008 | Guo et al. | |
| 2008/0121620 | A1 | 5/2008 | Guo et al. | |
| 2012/0031755 | A1 | 2/2012 | Guo | |
| 2012/0285819 | A1 * | 11/2012 | Child | .................. C23C 14/3464 |
|  |  |  |  | 204/192.12 |
| 2017/0327941 | A1 | 11/2017 | Kim et al. | |
| 2019/0136368 | A1 * | 5/2019 | Kim | ........................ H01J 37/34 |

FOREIGN PATENT DOCUMENTS

| JP | 2004346387 A | 12/2004 |  |  |
|---|---|---|---|---|
| JP | 2016108610 A | 6/2016 |  |  |
| JP | 2019502030 A | 1/2019 |  |  |
| KR | 20170082654 A | 7/2017 |  |  |
| KR | 20190051319 A | 5/2019 |  |  |
| TW | 201822376 A | 6/2018 |  |  |
| WO | WO-2012033198 A1 * | 3/2012 | .......... | H01J 37/3417 |
| WO | 2017112439 A1 | 6/2017 |  |  |

OTHER PUBLICATIONS

Office Action issued on Jul. 2, 2024, by the Taiwanese Patent Office in corresponding Taiwanese Patent Application No. 113102214, and an English Translation of the Office Action. (17 pages).

The extended European Search Report issued on Sep. 10, 2025, by the European Patent Office in corresponding European Application No. 21955932.5. (9 pages).

Office Action (Notice of Preliminary Rejection) issued on Nov. 24, 2025, by the Korean Patent Office in corresponding Korean Patent Application No. 10-2024-7009859, and an English Translation of the Office Action. (21 pages).

* cited by examiner

F I G.  6
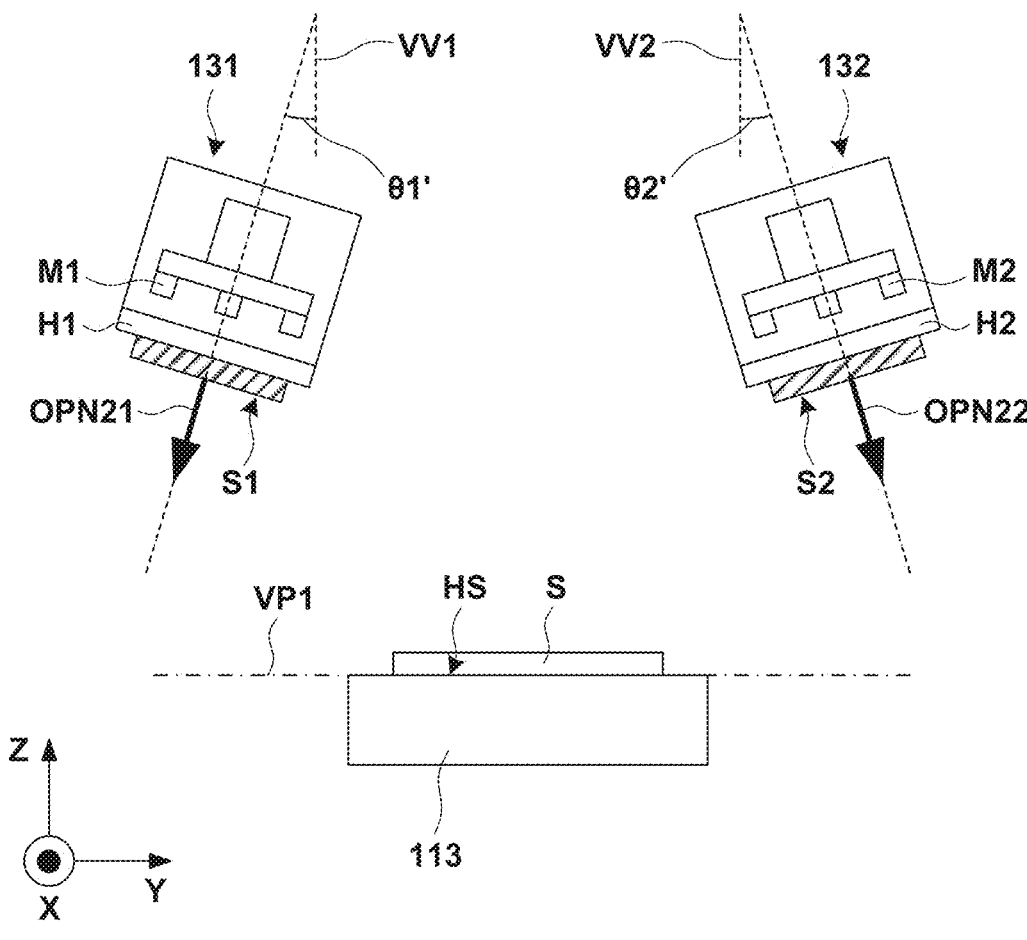

F I G.  11
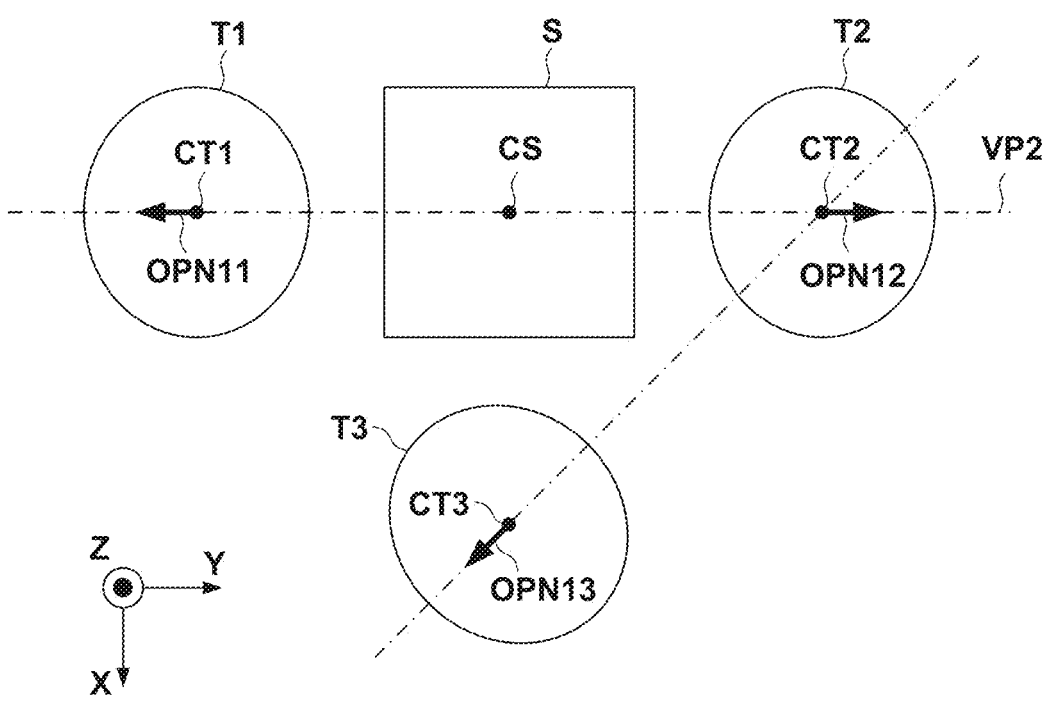

SPUTTERING APPARATUS

CROSS-REFERENCE TO RELATED APPLICATION

This application is a Continuation of International Patent Application No. PCT/JP2021/031983, filed Aug. 31, 2021, which is hereby incorporated by reference herein in their entirety.

BACKGROUND OF THE INVENTION

Field of the Invention

The present invention relates to a sputtering apparatus.

Background Art

There is a sputtering apparatus that arranges a plurality of targets in a chamber, and forms a plurality of films by selectively using the targets. In such the sputtering apparatus, cross contamination among the targets can occur. Cross contamination is a phenomenon in which the first material discharged from the first target made of the first material adheres to the second target made of the second material, or the second material discharged from the second target adheres to the first target. If cross contamination occurs, a film in which the first material and the second material are mixed is formed, and this can cause a problem that a desired film cannot be obtained.

Japanese Patent Laid-Open No. 2019-502030 describes a process chamber that includes a plurality of targets, and a shield including a hole for exposing the target to be sputtered of the plurality of targets and a pocket for accommodating the target not to be sputtered of the plurality of targets. In this process chamber, a film can be formed using the selected target by driving the shield such that the selected target is exposed through the hole and the remaining target is accommodated in the pocket. According to the configuration as described above, cross contamination can be prevented.

However, the configuration to select the target to be used by driving a movable part such as the shield as in the process chamber described in Japanese Patent Laid-Open No. 2019-502030 complicates the arrangement of the sputtering apparatus. In addition, movement of the movable part can cause generation of particles.

SUMMARY OF THE INVENTION

The present invention has as its object to provide a technique advantageous in reducing cross contamination with a simple arrangement.

A first aspect of the present invention is directed to a sputtering apparatus, and the sputtering apparatus comprises: a processing chamber; a substrate holder configured to hold a substrate with a substrate holding surface in a processing space in the processing chamber; a first target holder configured to hold a first target such that a first surface of the first target faces the processing space; and a second target holder configured to hold a second target such that a second surface of the second target faces the processing space, wherein the first target holder holds the first target such that an orthogonal projection vector of a first normal vector, which is a normal vector of the first surface, with respect to a virtual plane including the substrate holding surface is directed to a direction away from the substrate, and the second target holder holds the second target such that an orthogonal projection vector of a second normal vector, which is a normal vector of the second surface, with respect to the virtual plane is directed to a direction away from the substrate.

A second aspect of the present invention is directed to a film formation method. The method forms a film on a substrate in a spattering apparatus that comprises a processing chamber, a substrate holder configured to hold the substrate with a substrate holding surface in a processing space in the processing chamber, a first target holder configured to hold a first target such that a first surface of the first target faces the processing space, and a second target holder configured to hold a second target such that a second surface of the second target faces the processing space. The method comprises: a step of holding, by the first target holder, the first target such that an orthogonal projection vector of a first normal vector, which is a normal vector of the first surface, with respect to a virtual plane including the substrate holding surface is directed to a direction away from a position at which the substrate is to be arranged, a step of holding, by the second target holder, the second target such that an orthogonal projection vector of a second normal vector, which is a normal vector of the second surface, with respect to the virtual plane is directed to a direction away from the position at which the substrate is to be arranged, a step of forming a first film on the substrate while sputtering the first target, and a step of forming a second film on the substrate while sputtering the second target.

Further features of the present invention will become apparent from the following description of exemplary embodiments with reference to the attached drawings.

BRIEF DESCRIPTION OF DRAWINGS

FIG. 6 is a view schematically showing the relative arrangement of the first target, the second target, and the substrate;

FIG. 11 is a view showing another example in which the sputtering apparatus includes three target holders so as to hold three targets.

DESCRIPTION OF EMBODIMENTS

Figure 1:
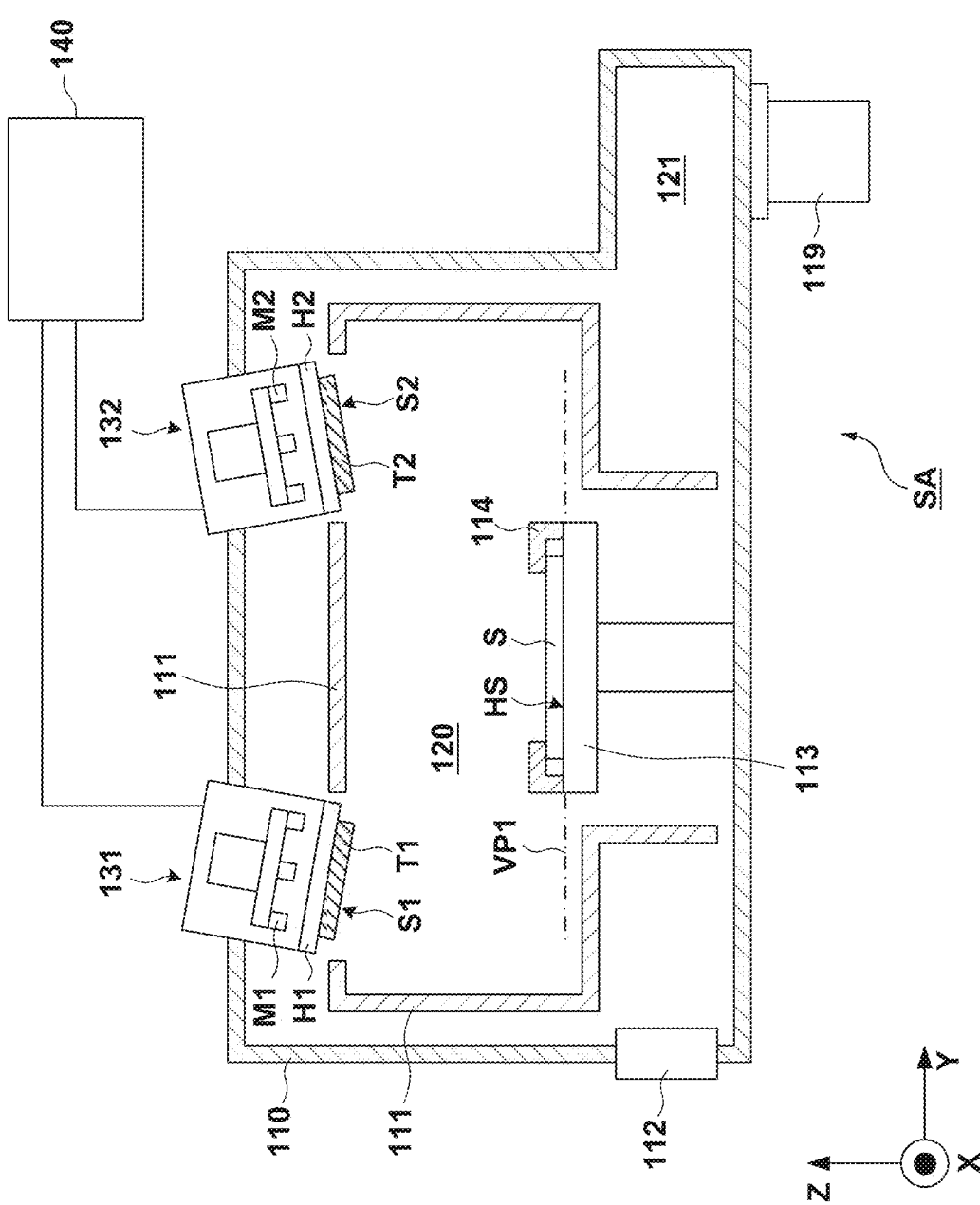
FIG. 1 is a view schematically showing the arrangement of a sputtering apparatus according to an embodiment.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted. In the attached drawings, directions, the positional relationship among a plurality of components, and postures are indicated in an XYZ coordinate system.

FIG. 1 schematically shows the arrangement of a sputtering apparatus SA according to an embodiment. The sputtering apparatus SA can include a processing chamber 110 that separates the internal space from the external space. The internal space can include a processing space 120 and an exhaust space 121. The processing space 120 and the exhaust space 121 communicate with each other. The sputtering apparatus SA can include a substrate holder 113 that holds a substrate S in the processing space 120 of the processing chamber 110. The substrate holder 113 can include a substrate holding surface HS for holding the substrate S, and can be configured to hold the substrate S with the substrate holding surface HS. The substrate holding surface HS may include a plane extending so as to have an area larger than the area of the back surface (the surface on the opposite side of the surface on which a film is to be formed) of the substrate S, or may be a virtual plane including a plurality of contact regions (tips of a plurality of pins for supporting the back surface of the substrate S) that contact the back surface of the substrate S.

The sputtering apparatus SA can include a plurality of sputtering modules. The number of the plurality of sputtering modules can be, for example, two, three, four, five, six, seven, eight, nine, or ten. The plurality of sputtering modules can include a first sputtering module 131 and a second sputtering module 132. The first sputtering module 131 can include a first target holder H1 that holds a first target T1 such that a first surface S1 of the first target T1 faces the processing space 120. The first sputtering module 131 may include a first magnet M1. The first sputtering module 131 may include the first rotation mechanism that rotates the first magnet M1. The second sputtering module 132 can include a second target holder 21 that holds a second target T2 such that a second surface S2 of the second target T2 faces the processing space 120. The second sputtering module 132 may include a second magnet M2. The second sputtering module 132 may include the second rotation mechanism that rotates the second magnet M2.

In another point of view, the sputtering apparatus SA can include a plurality of target holders. The number of the plurality of target holders can be, for example, two, three, four, five, six, seven, eight, nine, or ten. Each of the plurality of target holders can hold the target such that the surface (the surface to be sputtered) of the target faces the processing space 120. The plurality of target holders can include the first target holder H1 that holds the first target T1 such that the first surface S1 of the first target T1 faces the processing space 120, and the second target holder H2 that holds the second target T2 such that the second surface S2 of the second target 12 faces the processing space 120.

The substrate holder 113 can include a substrate fixing portion 114 that fixes the substrate S. The substrate fixing portion 114 may be configured to mechanically fix the substrate S by bringing a solid member into contact with the substrate S, may be configured to fix the substrate S by vacuum suction, may be configured to fix the substrate S by an electrostatic force, or may be configured to fix the substrate S by another method.

The sputtering apparatus SA can include a valve 112. The sputtering apparatus SA can be coupled to another chamber, for example, a load lock chamber or a conveyance chamber via the valve 112. A conveyance mechanism (not shown) can convey the substrate S, via the valve 112, from the external space of the processing chamber 110 of the sputtering apparatus SA to the internal space of the processing chamber 110, or from the internal space of the processing chamber 110 to the external space.

The sputtering apparatus SA can include an exhaust unit 119. The exhaust unit 119 can be arranged so as to communicate with the exhaust space 121. The sputtering apparatus SA may include a shield 111, and the shield 111 can be arranged so as to surround at least a part of the processing space 120 in the internal space of the processing chamber 110. The shield 111 can be arranged so as to at least partially separate the processing space 120 from the exhaust space 121. The shield 111 can include a plurality of openings, and the plurality of target holders (for example, the target holders H1 and H2) can hold the plurality of targets such that the surfaces of the plurality of targets (for example, the targets T1 and T2) face the processing space 120 via the plurality of openings.

The processing chamber 110 may include a lid portion, and the plurality of sputtering modules (for example, the sputtering modules 131 and 132) may be arranged in the lid portion. The substrate S may be arranged such that the normal direction of the surface, on which a film is to be formed, is directed upward. In this case, the plurality of targets (for example, the targets T1 and T2) can be arranged higher than the substrate S. The substrate S may be arranged such that the normal direction of the surface, on which a film is to be formed, is directed downward. In this case, the plurality of targets (for example, the targets T1 and T2) can be arranged lower than the substrate S. The substrate S may be arranged such that the normal direction of the surface, on which a film is to be formed, is directed to a horizontal direction.

The plurality of target holders (for example, the target holders H1 and H2) may be configured to be capable of adjusting the posture of the surface (the direction to which the normal of the surface is directed) of the held target. The plurality of target holders (for example, the target holders H1 and H2) can function as cathodes, and the plurality of target holders can be individually applied with a voltage from a power supply 140.

Figure 2:
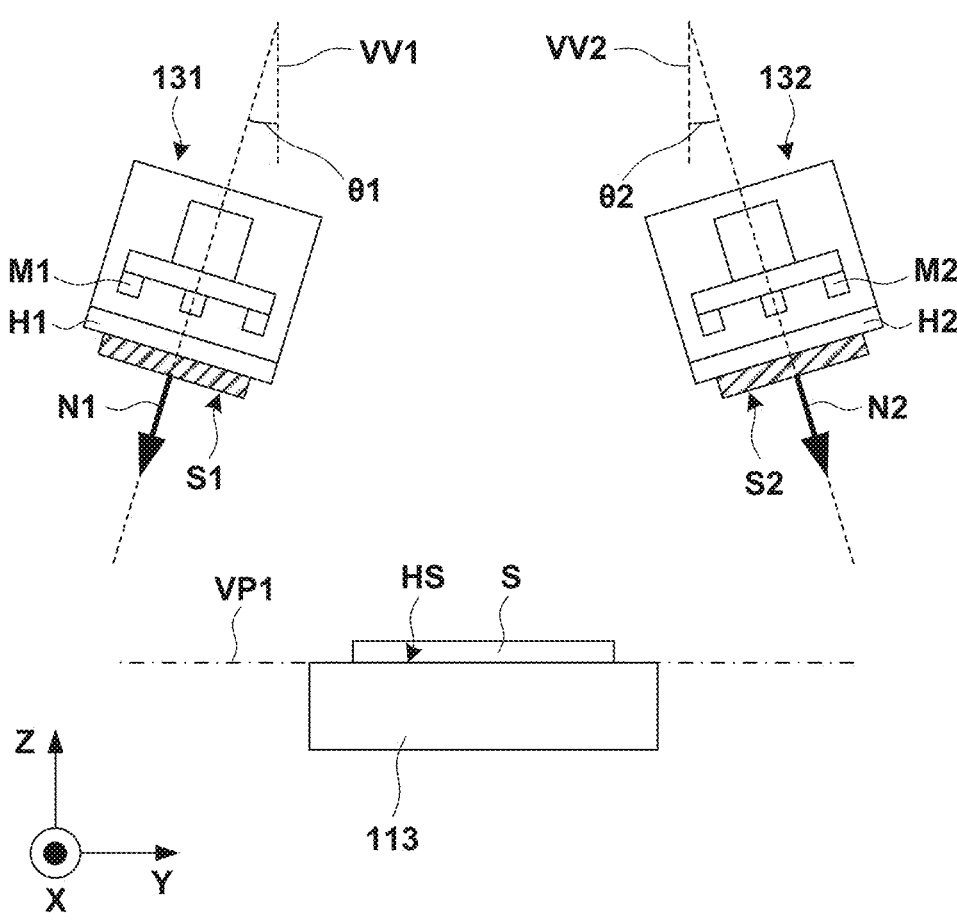
FIG. 2 is a view schematically showing the relative arrangement of a first target, a second target, and a substrate.
Figure 3:
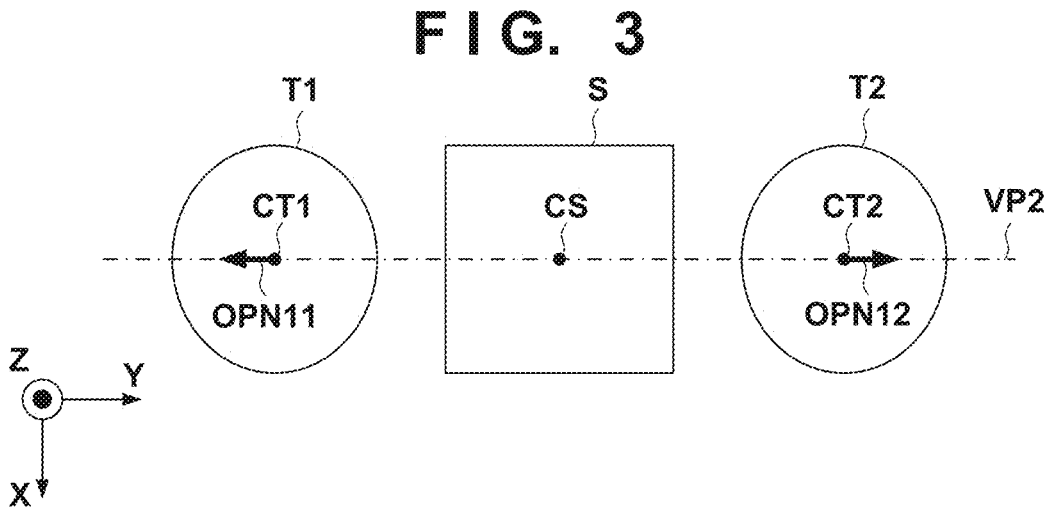
FIG. 3 is a view schematically showing the relative arrangement of the first target, the second target, and the substrate.

FIGS. 2 and 3 schematically show the relative arrangement of the first target T1, the second target T2, and the substrate S. FIG. 2 exemplarily shows a first normal vector N1, which is the normal vector of the first surface S1 of the first target T1, and a second normal vector N2, which is the normal vector of the second surface S2 of the second target T2. FIG. 3 exemplarily shows an orthogonal projection vector OPN11 of the first normal vector N1 with respect to a virtual plane VP1 including the substrate holding surface HS, and an orthogonal projection vector OPN12 of the second normal vector N2 with respect to the virtual plane VP1. FIG. 3 exemplarily shows the positional relationship among a center CS of the substrate S, a center CT1 of the first target T1, and a center CT2 of the second target T2.

As exemplarily shown in FIGS. 2 and 3, the first target holder H1 can hold the first target T1 such that the orthogonal projection vector OPN11 of the first normal vector N1 with respect to the virtual plane VP1 including the substrate holding surface HS is directed to a direction away from the substrate S. In addition, the second target holder H2 can hold the second target T2 such that the orthogonal projection vector OPN12 of the second normal vector N2 with respect to the virtual plane VP1 is directed to a direction away from the substrate S. Such the arrangement is advantageous in reducing cross contamination while simplifying the arrangement of the sputtering apparatus SA. Further, such the arrangement is advantageous in suppressing generation of particles.

Describing with reference to FIG. 2, in an example, an angle $\theta 1$ between the first normal vector N1 and a virtual straight line VV1 perpendicular to the virtual plane VP1 is preferably larger than $0°$. For example, the angle $\theta 1$ is preferably larger than $0°$ and equal to or smaller than 100 (that is, satisfies $0 \leq \theta 1 \leq 10°$), and further preferably larger than $0°$ and equal to or smaller than 50 (that is, satisfies $0<\theta 1 \leq 5°$). Further, an angle $\theta 2$ between the second normal vector N2 and a virtual straight line VV2 (this may be VV1 since VV1 and VV2 are parallel) perpendicular to the virtual plane VP1 is preferably larger than $0°$. For example, the angle $\theta 2$ preferably satisfies $0<\theta 1 \leq 10°$, and further preferably satisfies $0<\theta 1 \leq 5°$.

Here, when focus is placed on one target of the plurality of targets, for example, the target T1, the arrangement in which the target T1 is arranged such that the orthogonal projection vector OPN11 of the first normal vector N1 with respect to the virtual plane VP1 is directed to the direction away from the substrate S is advantageous, as compared to other arrangements, in decreasing the probability that material particles with high kinetic energy discharged from the first target T1 by sputtering the first target T1 reach the substrate S. This is effective for, for example, suppressing occurrence of a phenomenon (mixing) in which the material particles reach the underlying film (the film already existing under the film to be newly formed on the substrate S by sputtering the target T1) on the substrate S and mix into the underlying film. In such a point of view, the sputtering apparatus SA may be applied to an apparatus including a single target. Further, for example, when forming a desired stacked film by the first film formed on a substrate using a target made of the first material and the second film formed on the substrate using a target made of the second material, a film (mixing layer) where the first material and the second material are mixed is formed at the boundary between the first film and the second film, resulting in a problem that the desired stacked film cannot be obtained. Cross contamination and kinetic energy are considered as causes of the occurrence of mixing, but other causes are also considered, and the above description does not limit the cause of the occurrence of mixing.

In the example shown in FIG. 3, the center CS of the substrate S, the center CT1 of the first target T1, and the center CT2 of the second target T2 are arranged on a straight line. However, at least one of the center CS of the substrate S, the center CT1 of the first target T1, and the center CT2 of the second target T2 may be arranged at a position deviated from the straight line. In the arrangement shown in FIG. 3, the substrate S has a rectangular shape, but the substrate S may have another shape such as a circular shape. The distance between the first target T1 and the substrate S (for example, the distance between CT1 and the CS) may be equal to or different from the distance between the second target T2 and the substrate S (for example, the distance between CT2 and CS).

In the example shown in FIG. 3, the orthogonal projection vector OPN11 of the first normal vector N1 with respect to the virtual plane VP1 and the orthogonal projection vector OPN12 of the second normal vector N2 with respect to the virtual plane VP1 point in opposite directions on the same straight line. However, as exemplarily shown in each of FIGS. 4 and 5, the orthogonal projection vector OPN11 of the first normal vector N1 with respect to the virtual plane VP1 and the orthogonal projection vector OPN12 of the second normal vector N2 with respect to the virtual plane VP1 may not exist on the same straight line. Even in such the arrangement, it is preferable that $0<\theta 1$ and $0<\theta 2$ are satisfied. For example, it is preferable to satisfy $0<\theta 1 \leq 10°$ and $0<\theta 2 \leq 10°$, and it is further preferable to satisfy $0<\theta 1 \leq 5°$ and $0<\theta 2 \leq 5°$. Such the arrangement is advantageous in reducing cross contamination while simplifying the arrangement of the sputtering apparatus SA. Further, such the arrangement is advantageous in suppressing generation of particles.

Figure 4:
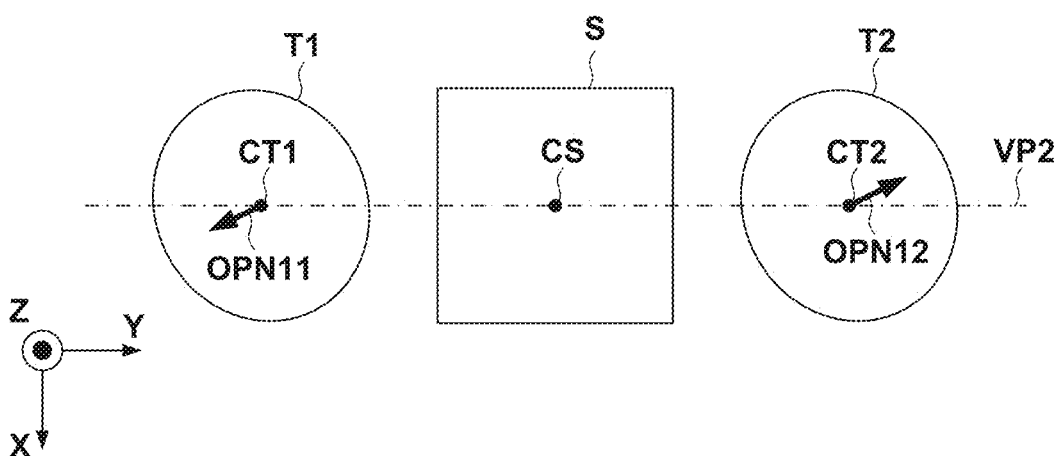
FIG. 4 is a view schematically showing another example of the relative arrangement of the first target, the second target, and the substrate.
Figure 5:
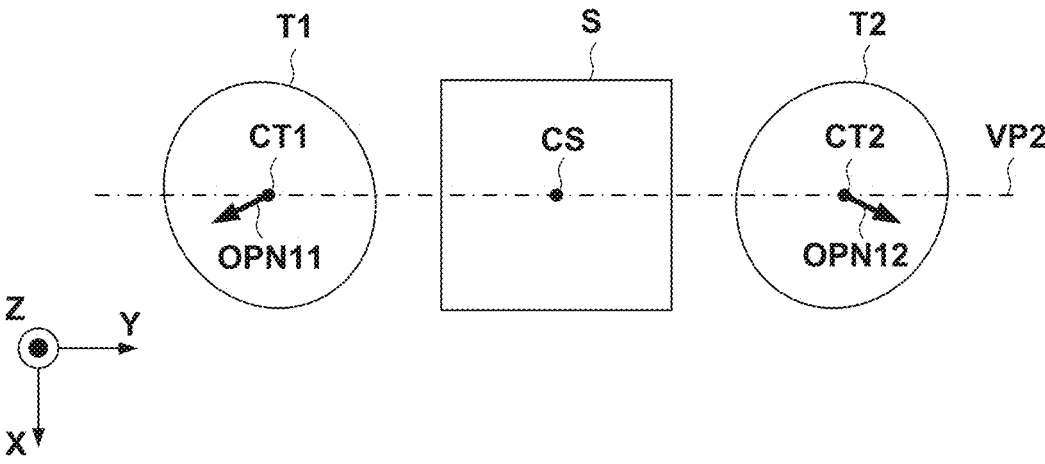
FIG. 5 is a view schematically showing still another example of the relative arrangement of the first target, the second target, and the substrate.

In another point of view, as exemplarily shown in each of FIGS. 3, 4, and 5, the first target holder H1 and the second target holder H2 may be arranged such that the center CT1 of the first target T1, the center CT2 of the second target T2, and the center CS of the substrate S are arranged on a second virtual plane VP2. FIG. 6 exemplarily shows an orthogonal projection vector OPN21 of the first normal vector N1 with respect to the second virtual plane VP2, and an orthogonal projection vector OPN22 of the second normal vector N2 with respect to the second virtual plane VP2. In such the arrangement, an angle $\theta 1'$ between the orthogonal projection vector OPN21 of the first normal vector N1 with respect to the second virtual plane VP2 and the virtual straight line VV1 perpendicular to the virtual plane VP1 is preferably larger than $0°$. For example, it is preferable to satisfy $0<\theta 1' \leq 10°$, and it is further preferable to satisfy $0<\theta 1' \leq 5°$. In addition, an angle $\theta 2'$ between the orthogonal projection vector OPN22 of the second normal vector N2 with respect to the second virtual plane VP2 and the virtual straight line VV2 (this may be VV1 since VV1 and VV2 are parallel) is preferably larger than $0°$. For example, it is preferable to satisfy $0<\theta 2' \leq 10°$, and it is further preferable to satisfy $0<\theta 2' \leq 5°$. Such the arrangement is advantageous in reducing cross contamination while simplifying the arrangement of the sputtering apparatus SA. Further, such the arrangement is advantageous in suppressing generation of particles.

In still another point of view, the second virtual plane VP2 shown in FIGS. 3, 4, and 5 may be defined as a plane including the center CT1 of the first target T1 and the center CT2 of the second target T2 and perpendicular to the virtual plane VP1. In this case, the center CS of the substrate S is not a factor which defines the second virtual plane VP2. In such the definition, the angle $\theta 1'$ between the orthogonal projection vector OPN21 of the first normal vector N1 with respect to the second virtual plane VP2 and the virtual straight line VV1 perpendicular to the virtual plane VP1 is preferably larger than $0°$. For example, it is preferable to satisfy $0<\theta 1' \leq 10°$, and it is further preferable to satisfy $0<\theta 1' \leq 5°$. Similarly, the angle $\theta 2'$ between the orthogonal projection vector OPN22 of the second normal vector N2 with respect to the second virtual plane VP2 and the virtual straight line VV2 (this may be VV1 since VV1 and VV2 are parallel) is preferably larger than 0°. For example, it is preferable to satisfy $0<\theta2'\leq10°$, and it is further preferable to satisfy $0<\theta2'\leq5°$.

Figure 7:
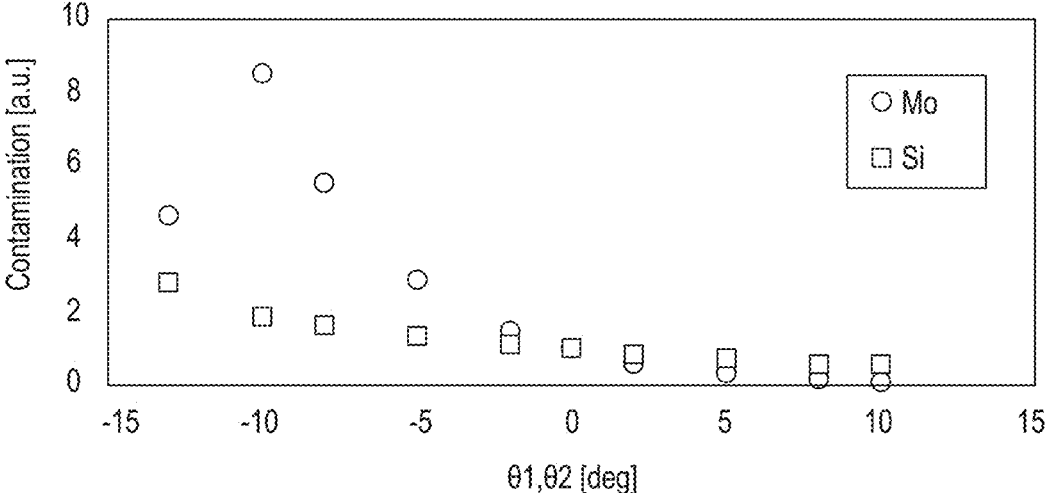
FIG. 7 is a graph showing results of simulation of changes in amount of cross contamination in a case of changing angles $\theta 1$ and $\theta 2$ of the first and second targets.

FIG. 7 shows results of simulation of changes in amount of cross contamination in a case of changing the angles $\theta1$ and $\theta2$ of the targets T1 and T2 in the arrangement shown in FIG. 2. The abscissa (cathode angle [deg]) represents the angles $\theta1$ and $\theta2$ (degrees) of the targets T1 and T2, and the ordinate (Contamination [a.u.]) represents the amount of cross contamination. In the example shown in FIG. 7, Mo is used as the target T1, and Si is used as the target T2. It can be seen that the amount of cross contamination is sufficiently small when $0<\theta1\leq10$ (degrees) and $0<\theta2\leq10$ (degrees). Further, it is suggested that the amount of cross contamination decreases as $\theta1$ and $\theta2$ become large. Note that if the materials of the targets T1 and T2 are changed, the ejected angle of sputtering change accordingly, but it has been confirmed that the amount of cross contamination is sufficiently small when $0<\theta1\leq10$ (degrees) and $0\leq\theta2\leq10$ (degrees).

Here, a method of evaluating the amount of cross contamination will be described. First, the first step is executed, in which sputtering electric discharge using the first target T1 is performed but sputtering electric discharge using the second target T2 is not performed. With the first step, the first film is formed on the substrate S by the first material which is the material of the first target T1. Then, the second step is executed, in which sputtering electric discharge using the first target T1 is not performed but sputtering electric discharge using the second target T2 is performed. With the second step, the second film is formed on the substrate S (the first film thereon) by the second material which is the material of the second target T2. Thereafter, the amount of the first material contained in the second film on the substrate S is evaluated. The amount of the first material contained in the second film can be evaluated as the amount of cross contamination. Cross contamination is a phenomenon in which the first material discharged from the first target T1 by sputtering in the first step adheres to the surface of the second target T2. The first material adhering to the surface of the second target T2 is discharged from the surface of the second target T2 by sputtering in the second step, and can mix into the second film on the substrate S.

Figure 8:
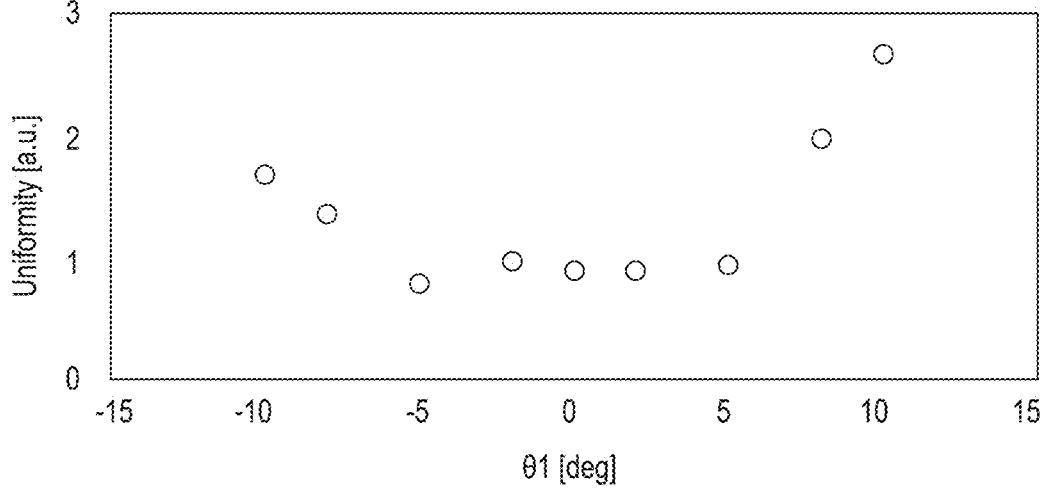
FIG. 8 is a graph showing results of simulation of the uniformity of film thickness of a film formed on the substrate in a case of changing the angle $\theta 1$ of the first target.

FIG. 8 shows results of simulation of the uniformity of film thickness of the film formed on the substrate S in a case of changing the angle $\theta1$ of the target T1 in the arrangement shown in FIG. 2. The abscissa (cathode angle [deg]) represents the angle $\theta1$ (degrees) of the target T1, and the ordinate (Uniformity [a.u.]) represents the uniformity of film thickness of the film formed on the substrate S. Here, a small value of the uniformity of film thickness means a small variation in film thickness, that is, the excellent uniformity of film thickness. From FIG. 8, it can be seen that the uniformity of film thickness is excellent when $0<\theta\leq5$ (degrees). Note that if the material of the target T1 is changed, the ejected angle of sputtering changes accordingly, but it has been confirmed that the uniformity of film thickness is excellent when $0<\theta1\leq5$ (degrees). It has also been confirmed that a similar result can be obtained in a case of changing the angle $\theta2$ of the target T2.

According to the simulation results described above, the range of $0<\theta1\leq5$ (degrees) and the range of $0<\theta2\leq5$ (degrees) are advantageous in reducing the amount of cross contamination, and also advantageous in implementing the excellent uniformity of film thickness. Note that the sputtering apparatus SA may include a rotation mechanism that rotates the substrate holder 113 about an axis perpendicular to the virtual plane VP1. In this case, the uniformity of film thickness can be improved. Therefore, the excellent uniformity of film thickness can be implemented even in the range of $\theta1$ and $\theta2$ larger than 5°.

Figure 9A:
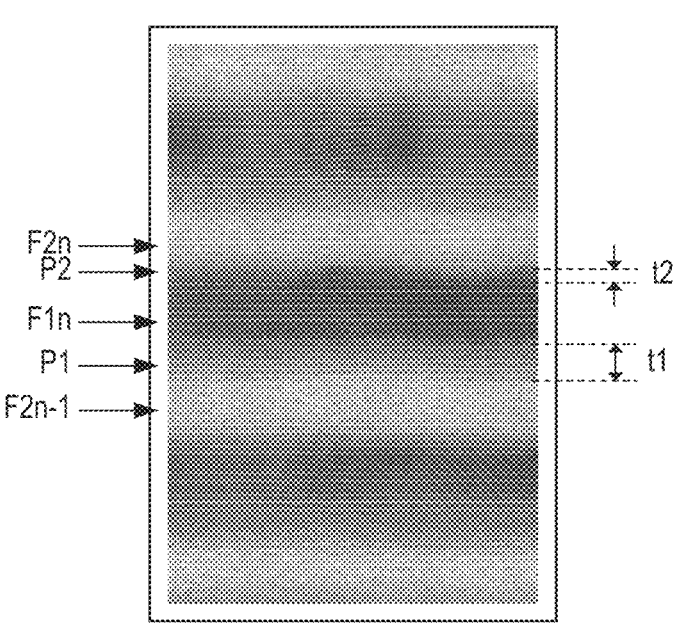
FIG. 9A is a view showing a TEM image of a stacked film actually formed on the substrate by the sputtering apparatus using the first and second targets.
Figure 9B:
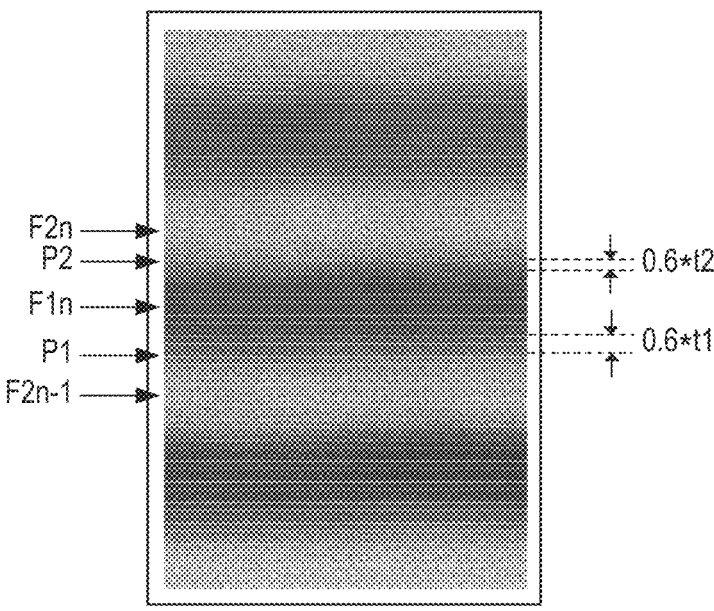
FIG. 9B is a view showing a TEM image of a stacked film actually formed on the substrate by the sputtering apparatus using the first and second targets.

Each of FIGS. 9A and 9B shows a TEM (transmission electron microscope) image of the stacked film actually formed on the substrate S by the sputtering apparatus SA using the targets T1 and T2. FIG. 9A shows the TEM image of the stacked film formed under the condition of $\theta1=\theta2=\theta$, and FIG. 9B shows the TEM image of the stacked film formed under the condition of $\theta1=\theta2=\theta+2°$. That is, $\theta1$ and $\theta2$ for obtaining the stacked film in FIG. 9B are larger than $\theta1$ and $\theta2$ for obtaining the stacked film in FIG. 9A, respectively.

In FIGS. 9A and 9B, F2$n$−1, Fln, and F2$n$ are the second film formed using the second target T2, the first film formed using the first target T1, and the second film formed using the second target T2, respectively. A mixing layer P1, in which the first material and the second material are mixed, exists in the boundary between the second film F2$n$−1 and the first film Fln. Similarly, a mixing layer P2, in which the first material and the second material are mixed, exits in the boundary between the first film Fln and the second film F2$n$. As a result of measurement, letting t1 and t2 be the thicknesses of the mixing layers P1 and P2 in FIG. 9A, respectively, the thicknesses of the mixing layers P1 and P2 in FIG. 9B are 0.6 times t1 and t2, respectively. This means that the thicknesses of the mixing layers P1 and P2 can be decreased by increasing $\theta1$ and $\theta2$, that is, mixing can be suppressed.

Figure 10:
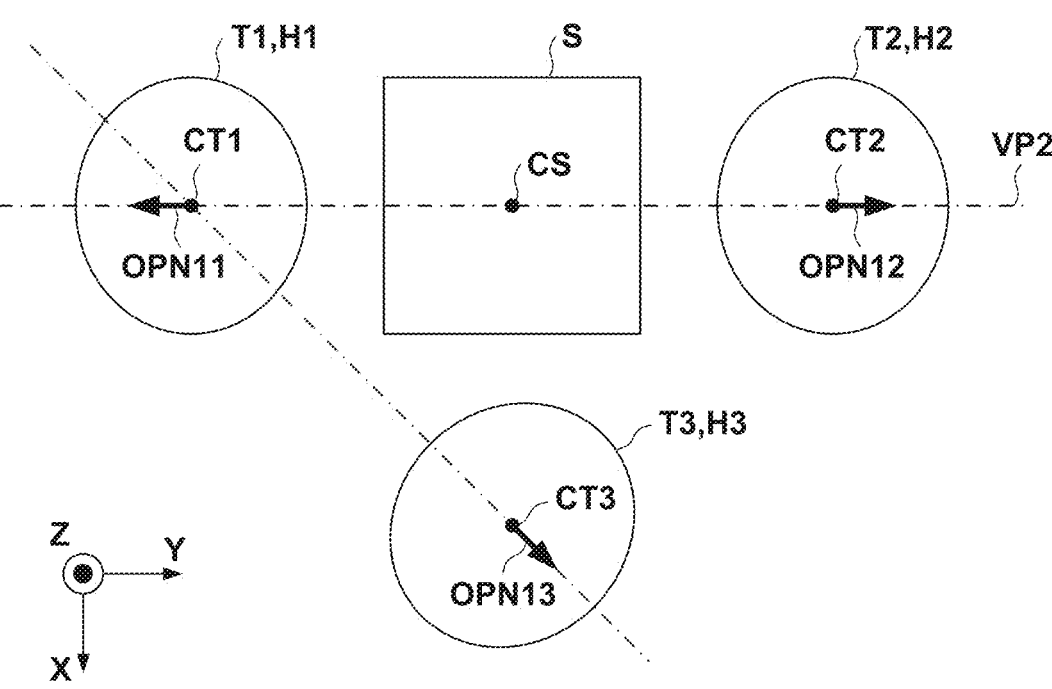
FIG. 10 is a view showing an example in which the sputtering apparatus includes three target holders so as to hold three targets.

FIG. 10 shows the first example in which the sputtering apparatus SA includes the target holders H1 and H2 and a target holder H3 that hold the targets T1 and T2 and a target T3, respectively. As in FIG. 3, the orthogonal projection vector OPN11 of the first normal vector N1 with respect to the virtual plane VP1 including the substrate holding surface HS and the orthogonal projection vector OPN12 of the second normal vector N2 with respect to the virtual plane VP1 are exemplarily shown in FIG. 10. An orthogonal projection vector OPN13 of the third normal vector with respect to the virtual plane VP1 including the substrate holding surface HS is also shown in FIG. 10. Here, the third normal vector is the normal vector of the third surface of the third target T3. The third target holder H3 can hold the third target T3 such that the orthogonal projection vector OPN13 of the third normal vector is directed to a direction away from the first target T1. In another point of view, the third target holder H3 can hold the third target T3 such that the orthogonal projection vector OPN13 of the third normal vector is directed to a direction away from the first target T1 and the substrate S. The first target holder H1 may hold the first target T1 such that the orthogonal projection vector OPN11 of the first normal vector N1 is directed to a direction away from the third target T3 and the substrate S. The arrangement shown in FIG. 10 is useful in a case in which the thickness t1 of the first film formed on the substrate S using the first target T1 is larger than the thickness t2 of the second film formed on the substrate S using the second target T2, and the thickness t2 of the second film is larger than the thickness of the third film t3 formed on the substrate S using the third target T3.

FIG. 11 shows the second example in which the sputtering apparatus SA includes the target holders H1, H2, and H3 that hold the targets T1, T2, and T3, respectively. As in FIG. 3, the orthogonal projection vector OPN11 of the first normal vector N1 with respect to the virtual plane VP1 including the substrate holding surface HS and the orthogonal projection vector OPN12 of the second normal vector N2 with respect to the virtual plane VP1 are exemplarily shown in FIG. 11. The orthogonal projection vector OPN13 of the third normal vector with respect to the virtual plane VP1 including the substrate holding surface HS is also shown in FIG. 11. Here, the third normal vector is the normal vector of the third surface of the third target T3. The third target holder H3 can hold the third target T3 such that the orthogonal projection vector OPN13 of the third normal vector is directed to a direction away from the second target T2. In another point of view, the third target holder H3 can hold the third target T3 such that the orthogonal projection vector OPN13 of the third normal vector is directed to a direction away from the second target T2 and the substrate S. The second target holder H2 may hold the second target T2 such that the orthogonal projection vector OPN12 of the second normal vector N2 is directed to a direction away from the third target T3 and the substrate S. The arrangement shown in FIG. 11 is useful in a case in which the thickness t2 of the second film formed on the substrate S using the second target T2 is larger than the thickness t1 of the first film formed on the substrate S using the first target T1, and the thickness t1 of the first film is larger than the thickness of the third film t3 formed on the substrate S using the third target T3.

Figure 12:
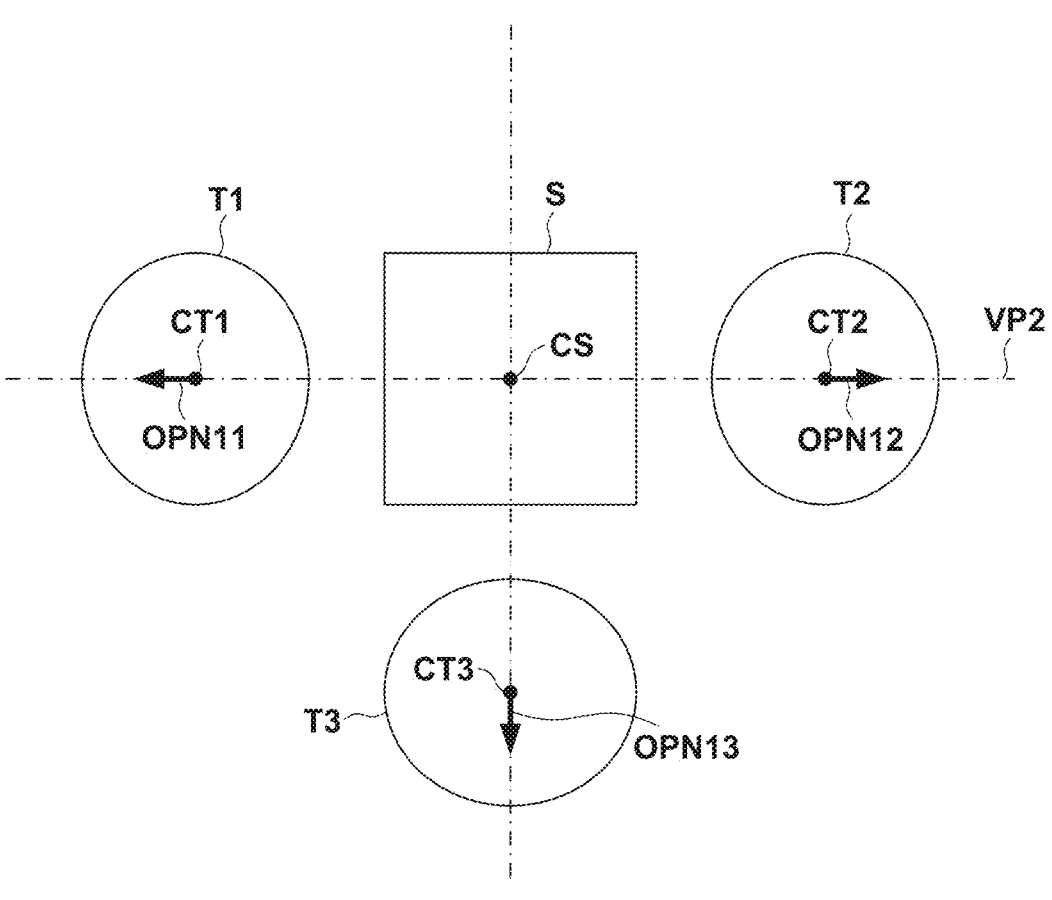
FIG. 12 is a view showing still another example in which the sputtering apparatus includes three target holders so as to hold three targets.

FIG. 12 shows the first example in which the sputtering apparatus SA includes the target holders H1, H2, and H3 that hold the targets T1, T2, and T3, respectively. As in FIG. 3, the orthogonal projection vector OPN11 of the first normal vector N1 with respect to the virtual plane VP1 including the substrate holding surface HS and the orthogonal projection vector OPN12 of the second normal vector N2 with respect to the virtual plane VP1 are exemplarily shown in FIG. 12. The orthogonal projection vector OPN13 of the third normal vector with respect to the virtual plane VP1 including the substrate holding surface HS is also shown in FIG. 12. Here, the third normal vector is the normal vector of the third surface of the third target T3. The third target holder H3 can hold the third target T3 such that the orthogonal projection vector OPN13 of the third normal vector is directed to a direction away from the substrate S. In another point of view, the third target holder H3 can hold the third target T3 such that the orthogonal projection vector OPN13 of the third normal vector is directed to a direction away from the substrate S, the first target T1, and the second target T2. The first target holder H1 may hold the first target T1 such that the orthogonal projection vector OPN11 of the first normal vector N1 is directed to a direction away from the third target T3 and the substrate S. The second target holder H2 may hold the second target T2 such that the orthogonal projection vector OPN12 of the second normal vector N2 is directed to a direction away from the third target T3 and the substrate S. The arrangement shown in FIG. 12 is useful in a case in which the thickness t1 of the first film formed on the substrate S using the first target T1 and the thickness t2 of the second film formed on the substrate S using the second target T2 are larger than the thickness t3 of the third film formed on the substrate S using the third target T3, and the difference between the thickness t1 of the first film and the thickness t2 of the second film is smaller than the difference between the thickness t1 of the first film and the thickness 3 of the third film or the difference between the thickness t2 of the second film and the thickness t3 of the third film.

A film formation method of forming a film on a substrate using the sputtering apparatus SA will be exemplarily described below. The film formation method can include a step of holding, by the first target holder H1, the first target T1 such that the orthogonal projection vector OPN11 of the first normal vector N1 with respect to the virtual plane VP1 including the substrate holding surface HS is directed to a direction away from the position at which the substrate S is to be arranged (or a predetermined position of the substrate holder 113, for example, the center). The film formation method can also include a step of holding, by the second target holder H2, the second target such that the orthogonal projection vector OPN12 of the second normal vector N2 with respect to the virtual plane VP1 is directed to a direction away from the position at which the substrate S is to be arranged (or a predetermined position of the substrate holder 113, for example, the center). The film formation method can also include a step of forming the first film on the substrate S while sputtering the first target T1 and a step of forming the second film on the substrate S while sputtering the second target T2 in a state in which the targets T1 and T2 are held by the target holders H1 and H2, respectively, and the substrate S is held by the substrate holder 113.

The present invention is not limited to the above embodiments and various changes and modifications can be made within the spirit and scope of the present invention. Therefore, to apprise the public of the scope of the present invention, the following claims are made.

REFERENCE SIGNS LIST

110: processing chamber, 120: processing space, S: substrate, HS: substrate holding surface, 113: substrate holder, T1: first target, T2: second target, H1: first target holder, H2: second target holder, VP1: virtual plane, N1: first normal vector, N2: second normal vector, OPN11: orthogonal projection vector, OPN12: orthogonal projection vector

The invention claimed is:

1. A sputtering apparatus comprising:
   a processing chamber;
   a substrate holder configured to hold a substrate with a substrate holding surface in a processing space in the processing chamber;
   a first sputtering module including a first target holder configured to hold a first target such that a first surface of the first target faces the processing space, a first magnet arranged to face the first target via the first target holder, and a first rotation mechanism configured to rotate the first magnet;
   a second sputtering module including a second target holder configured to hold a second target such that a second surface of the second target faces the processing space, a second magnet arranged to face the second target via the second target holder, and a second rotation mechanism configured to rotate the second magnet;
   a third target holder configured to hold a third target such that a third surface of the third target faces the processing space; and
   a shield arranged so as to surround at least a part of the processing space such that the processing space is separated, by the shield, from an exhaust space which is provided within the processing chamber and is exhausted by an exhaust unit, the shield including a top portion having first, second and third openings in which the first target holder, the second target holder, and the third target holder are disposed, respectively, and a bottom portion having a fourth opening in which the substrate holder is arranged, a lateral dimension of the substrate holder being smaller than a minimum lateral dimension of the fourth opening so that the exhaust space communicates with the processing space through a gap between the substrate holder and the bottom portion at the fourth opening, wherein a point of the first surface which is closest to the substrate or a point of the second surface which is closest to the substrate is exposed to a center of the substrate;

the first target holder holds the first target such that an orthogonal projection vector of a first normal vector, which is a normal vector of the first surface, with respect to a first virtual plane including the substrate holding surface is directed to a direction away from the substrate, the second target holder holds the second target such that an orthogonal projection vector of a second normal vector, which is a normal vector of the second surface, with respect to the first virtual plane is directed to a direction away from the substrate, the third target holder holds the third target such that an orthogonal projection vector of a third normal vector, which is a normal vector of the third surface, with respect to the first virtual plane is directed to a direction away from the substrate and away from one of the first target or the second target, the orthogonal projection vector of the third normal vector is parallel to an orthogonal projection, with respect to the first virtual plane, of a virtual straight line which passes through 1) a center of the first target or a center of the second target and 2) a center of the third target, and the lateral dimension of the substrate holder is smaller than a distance between the first target and the second target, the first target holder and the second target holder are arranged such that the center of the first target, the center of the second target, and the center of the substrate are arranged in a second virtual plane, the orthogonal projection vector of the first normal vector with respect to the first virtual plane and the orthogonal projection vector of the second normal vector with respect to the first virtual plane are both parallel to the second virtual plane, an angle between the first normal vector and a virtual straight line perpendicular to the virtual plane is larger than 0° and not larger than 10°, and an angle between the second normal vector and the virtual straight line perpendicular to the virtual plane is larger than 0° and not larger than 10°.

2. The sputtering apparatus according to claim 1, wherein a thickness of a first film formed on the substrate using the first target is larger than a thickness of a second film formed on the substrate using the second target, and the thickness of the second film is larger than a thickness of a third film formed on the substrate using the third target.

3. The sputtering apparatus according to claim 1, wherein a thickness of a first film formed on the substrate using the first target and a thickness of a second film formed on the substrate using the second target are larger than a thickness of a third film formed on the substrate using the third target, and a difference between the thickness of the first film and the thickness of the second film is smaller than one of a difference between the thickness of the first film and the thickness of the third film, and a difference between the thickness of the second film and the thickness of the third film.

* * * * *